US012566906B2

(12) United States Patent
Chen et al.

(10) Patent No.: US 12,566,906 B2
(45) Date of Patent: Mar. 3, 2026

(54) WELL PATTERN OPTIMIZATION METHOD BASED ON CO$_2$ INCOMPLETE MISCIBLE DISPLACEMENT CHARACTERISTICS

(71) Applicant: CHINA UNIVERSITY OF PETROLEUM (Beijing), Beijing (CN)

(72) Inventors: Hao Chen, Beijing (CN); Xiliang Liu, Beijing (CN); Borui Li, Beijing (CN); Weiming Cheng, Beijing (CN); Xiaofeng Tian, Beijing (CN); Xianhong Tan, Beijing (CN); Lijun Zhang, Beijing (CN); Yang Li, Beijing (CN); Renfeng Yang, Beijing (CN); Mingsheng Zuo, Beijing (CN); Baoxi Yang, Beijing (CN); Ruwei Zhang, Beijing (CN); Qiuting Li, Beijing (CN); Zhizhen Lin, Beijing (CN)

(73) Assignee: CHINA UNIVERSITY OF PETROLEUM (Beijing), Beijing (CN)

( * ) Notice: Subject to any disclaimer, the term of this patent is extended or adjusted under 35 U.S.C. 154(b) by 0 days.

(21) Appl. No.: 19/066,395

(22) Filed: Feb. 28, 2025

(65) Prior Publication Data

US 2025/0278542 A1      Sep. 4, 2025

(30) Foreign Application Priority Data

Mar. 1, 2024    (CN) .......................... 202410235768.0

(51) Int. Cl.
*G06F 30/28*        (2020.01)
*E21B 43/16*        (2006.01)
(Continued)

(52) U.S. Cl.
CPC .............. *G06F 30/28* (2020.01); *E21B 49/00* (2013.01); *E21B 43/164* (2013.01); *E21B 43/30* (2013.01); *E21B 2200/20* (2020.05)

(58) Field of Classification Search
CPC ........ G06F 30/28; E21B 49/00; E21B 43/164; E21B 43/30; E21B 2200/20
(Continued)

(56) References Cited

U.S. PATENT DOCUMENTS

2006/0224369  A1    10/2006  Yang et al.
2012/0053920  A1     3/2012  Rai et al.

FOREIGN PATENT DOCUMENTS

CA          2514516 A    11/2004
CN      104453804 A     3/2015
(Continued)

OTHER PUBLICATIONS

Elias Jr, A., and Osvair V. Trevisan. "An experimental investigation on phase behavior of a light oil and CO2." Journal of petroleum science and engineering 145 (2016): 22-33. (Year: 2016).*
(Continued)

*Primary Examiner* — John E Johansen
(74) *Attorney, Agent, or Firm* — Pilloff Passino & Cosenza LLP; Rachel Pilloff; Sean Passino

(57)      ABSTRACT

A well pattern optimization method based on CO$_2$ incomplete miscible displacement characteristics is provided, including: obtaining fluid component data of formation crude oil, and establishing a fluid component model based on the fluid component data; establishing a three-dimensional reservoir model based on the fluid component model, and setting reservoir parameters for the three-dimensional reservoir model; performing simulation operation on the three-dimensional reservoir model with set reservoir parameters under different CO$_2$ flooding well pattern modes, and obtaining simulation operation results; and performing
(Continued)

analysis of fronts and production parameter comparison on the simulation operation results, and obtaining an optimal $CO_2$ flooding well pattern mode.

4 Claims, 11 Drawing Sheets

(51) Int. Cl.
  *E21B 43/30*   (2006.01)
  *E21B 49/00*   (2006.01)
(58) Field of Classification Search
  USPC ........................................................... 703/10
  See application file for complete search history.

(56)     References Cited

FOREIGN PATENT DOCUMENTS

| | | | |
|---|---|---|---|
| CN | 109594965 | A | 4/2019 |
| CN | 110259441 | A | 9/2019 |
| CN | 110318718 | A | 10/2019 |
| CN | 111305801 | A | 6/2020 |
| CN | 112069737 | A | 12/2020 |
| CN | 115310645 | A | 11/2022 |

OTHER PUBLICATIONS

Li, Songyan, Peng Wu, and Kaiqiang Zhang. "Complex foam flow in series and parallel through multiscale porous media: Physical model interpretation." International Journal of Heat and Mass Transfer 164 (2021): 120628. (Year: 2021).*
Cao Zhenyi, et al., Well Pattern Optimization and Influencing Factors for CO2 Injection of Horizontal Wells in Low Permeability Reservoir, Geoscience, Apr. 15, 2016, vol. 30, No. 2, pp. 382-387 doi: 10.3969/j.issn.1000-8527.2016.02.013 Claims involved:1-5.
Qiu Weisheng, Optimization of injection-production pattern for CO2 flooding in deep low-permeability reservoir, Inner Mongolia Petrochemical Industry, Jun. 30, 2023, pp. 87-88 Claims involved:1-5.
Retrieval report—First search dated Jul. 10, 2024 in SIPO application No. 202410235768.0.
Notification to Grant Patent Right for Invention dated Jul. 18, 2024 in SIPO application No. 202410235768.0.

* cited by examiner

Five-spot well pattern        Inverted seven-spot well pattern        Inverted nine-spot well pattern

1

WELL PATTERN OPTIMIZATION METHOD BASED ON CO₂ INCOMPLETE MISCIBLE DISPLACEMENT CHARACTERISTICS

CROSS-REFERENCE TO RELATED APPLICATIONS

This application claims priority to Chinese Patent Application No. 202410235768.0, filed on Mar. 1, 2024, the contents of which are hereby incorporated by reference.

TECHNICAL FIELD

The present disclosure relates to the field of well pattern optimization technology, and particularly to a well pattern optimization method based on $CO_2$ incomplete miscible displacement characteristics.

BACKGROUND

In recent years, the proven reserves of low permeability reservoirs in China have been increasing year by year, with low permeability reservoirs accounting for more than 80% of the total. Consequently, the focus of production has gradually shifted to low permeability reservoirs. Low permeability reservoirs in China may be classified into three types: reservoirs with permeability between 10-50 milliDarcy (mD) are referred to as low permeability reservoirs, reservoirs with permeability between 1-10 mD are referred to as ultra-low permeability reservoirs, and reservoirs with permeability between 0.1-1 mD are referred to as super-low permeability reservoirs. Low permeability reservoirs are characterized by strong reservoir heterogeneity, complex pore structures, and the development of micro-nano-scale pore throats. Conventional depletion development and water injection development face issues such as poor energy replenishment and low recovery rates. For low permeability reservoirs, gas injection enhanced oil recovery technology may effectively address these issues, and $CO_2$ injection has lower miscible pressure, stronger extraction capability, and better crude oil viscosity reduction effects compared to $N_2$ injection.

Currently, $CO_2$ injection development in low permeability reservoirs, due to the relatively small pores, narrow throats, and poor connectivity between pores, often results in a pressure funnel phenomenon between injection and production wells, where pressure decreases from the injection well to the production well. Even if the average reservoir pressure is higher than the minimum miscible pressure of $CO_2$-crude oil, it is common for the reservoir pressure not to be entirely above the minimum miscible pressure of $CO_2$-crude oil. The displacement in this case is called incomplete miscible displacement.

Common $CO_2$ injection well patterns include five-spot pattern, inverted seven-spot pattern, and inverted nine-spot pattern. The five-spot pattern has high control over sand bodies and strong injection-production intensity, which helps maintain high reservoir pressure and flow capacity, but the control effect on individual wells is limited. The inverted seven-spot pattern has uniform injection-production well spacing and high control over sand bodies, but adjustment to the injection and production well patterns in the later stage is difficult. The inverted nine-spot well pattern has many oil wells and a high oil production speed in the early stage, and flexible adjustment to the injection and production well patterns in the later stage. However, the injection-production well spacing is uneven, leading to early gas breakthrough and difficulty in maintaining formation pressure, with poor control over sand bodies. Each well pattern has its advantages and disadvantages, but the existing well pattern selection methods do not consider the typical incomplete miscible displacement characteristics of low permeability reservoirs, leading to errors in recovery rate evaluation, gas breakthrough time prediction, and oil-gas migration laws. This is not conducive to well pattern planning under real low permeability reservoir conditions, making policy formulation for low permeability reservoir development challenging. Therefore, there is an urgent need for a well pattern optimization method based on $CO_2$ incomplete miscible displacement characteristics.

SUMMARY

An objective of the present disclosure is to provide a well pattern optimization method based on $CO_2$ incomplete miscible displacement characteristics, which integrates economic factors that need to be considered in the well pattern optimization process such as reservoir recovery rate, cumulative oil production, oil exchange ratio, and storage ratio, as well as social factors related to achieving national carbon neutrality goals, providing an important basis for the economic and rational design of $CO_2$ injection development plans for reservoirs.

To achieve the above objective, the present disclosure provides the following solution.

A well pattern optimization method based on $CO_2$ incomplete miscible displacement characteristics, including:

obtaining fluid component data of formation crude oil, and establishing a fluid component model based on the fluid component data;

establishing a three-dimensional reservoir model based on the fluid component model, and setting reservoir parameters for the three-dimensional reservoir model;

performing simulation operation on the three-dimensional reservoir model with set reservoir parameters under different $CO_2$ flooding well pattern modes, and obtaining simulation operation results; and performing analysis of fronts and production parameter comparison on the simulation operation results, and obtaining an optimal $CO_2$ flooding well pattern mode.

Optionally, obtaining the fluid component data of the formation crude oil includes:

analyzing the formation crude oil using high-temperature and high-pressure pressure-volume-temperature (PVT) experiments to obtain the fluid component data, where the high-temperature and high-pressure PVT experiments include constant composition expansion experiments, multi-stage degassing experiments, and gas injection expansion experiments.

Optionally, establishing the fluid component model based on the fluid component data includes:

fitting the fluid component data and experimental result data from the high-temperature and high-pressure PVT experiments, and outputting the fluid component model when a fitting effect is greater than a preset value.

Optionally, the reservoir parameters include: a reservoir depth, a reservoir temperature, a reservoir pressure, a reservoir porosity, reservoir permeability, reservoir oil saturation, a temperature gradient, a pressure coefficient, and a reservoir saturation pressure.

Optionally, the $CO_2$ flooding well pattern modes set one injection well and at least one production well, and adopt a production system with a fixed $CO_2$ injection volume, a fixed injection pressure, and a fixed production pressure.

Optionally, the fronts include: a miscible pressure front, a component front, and a phase front, where the miscible pressure front is a position with a formation pressure between injection and production wells equaling a minimum miscible pressure of $CO_2$ and crude oil, the component front is a position closest to an injection well swept by a zero mole fraction of a $CO_2$ component between the injection and production wells during a displacement process, and the phase front is a position closest to a production well swept by a zero oil-gas interfacial tension between the injection and production wells during the displacement process.

Optionally, performing the analysis of the fronts on the simulation operation results includes:

analyzing different field maps of the simulation operation results under different $CO_2$ flooding well pattern modes, and obtaining migration laws of the miscible pressure front, the component front, and the phase front;

based on the migration laws of the miscible pressure front, the component front, and the phase front, judging retreat speeds of the miscible pressure front, $CO_2$ sweep efficiencies, and miscibility degrees under different $CO_2$ flooding well pattern modes; and obtaining front analysis results based on the retreat speeds of the miscible pressure front, the $CO_2$ sweep efficiencies, and the miscibility degrees.

Optionally, performing the production parameter comparison on the simulation operation results includes:

analyzing oil production, gas production, and gas injection curves in the simulation operation results under different $CO_2$ flooding well pattern modes, comparing reservoir recovery rates, cumulative oil production, oil exchange ratios, and storage ratios under different $CO_2$ flooding well pattern modes, and obtaining production parameter comparison results.

Optionally, obtaining the optimal $CO_2$ flooding well pattern mode includes:

combining the front analysis results and the production parameter comparison results for analysis and selection, and obtaining the optimal $CO_2$ flooding well pattern mode.

The beneficial effects of the present disclosure are as follows.

The present disclosure improves the problems of errors in oil recovery rate evaluation, gas breakthrough time prediction and oil-gas migration laws, and inaccurate well pattern planning caused by the lack of consideration of the incomplete miscible displacement characteristics in existing well pattern optimization methods. Based on the $CO_2$ incomplete miscible displacement characteristics, numerical simulations of different well patterns in low permeability reservoirs are conducted, clarifying the laws of component front, phase front, and pressure front during the development of low permeability reservoirs using $CO_2$. On this basis, economic factors such as reservoir recovery rate, cumulative oil production, oil exchange ratio, and storage ratio, as well as the social benefits of $CO_2$ storage for energy saving and emission reduction, are considered to formulate an optimization plan for reservoir well spacing. The well pattern optimization method based on the $CO_2$ incomplete miscible displacement characteristics is established, providing an important basis for the economic and rational design of $CO_2$ injection development plans for reservoirs.

BRIEF DESCRIPTION OF THE DRAWINGS

In order to explain the embodiments of the present disclosure or the technical solution in the prior art more clearly, the drawings needed in the embodiments will be briefly introduced below. Apparently, the drawings in the following description are only some embodiments of the present disclosure. For one of ordinary skill in the art, other drawings may be obtained according to these drawings without creative effort.

DETAILED DESCRIPTION OF THE EMBODIMENTS

In the following, the technical solutions in the embodiments of the present disclosure will be clearly and completely described with reference to the attached drawings. Apparently, the described embodiments are only a part of the embodiments of the present disclosure, but not all the embodiments. Based on the embodiments in the present disclosure, all other embodiments obtained by one of ordinary skill in the art without creative effort belong to the protection scope of the present disclosure.

In order to make the above objects, features and advantages of the present disclosure more obvious and easier to understand, the present disclosure will be further described in detail with the attached drawings and specific embodiments.

Figure 1:
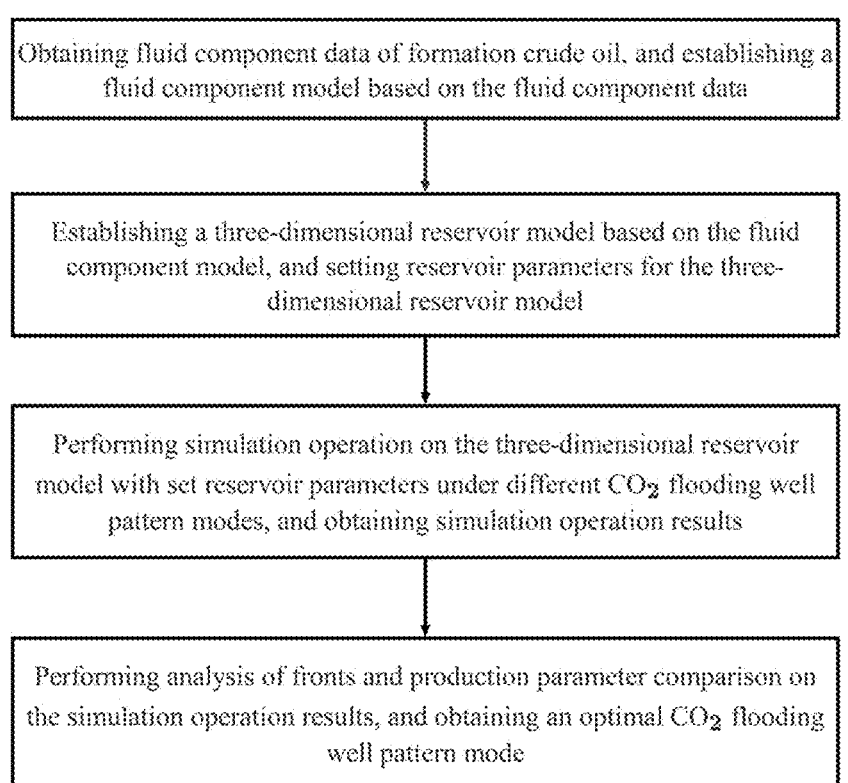
FIG. 1 is a flowchart of a well pattern optimization method based on $CO_2$ incomplete miscible displacement characteristics according to an embodiment of the present disclosure.

This embodiment provides a well pattern optimization method based on $CO_2$ incomplete miscible displacement characteristics, as shown in FIG. 1, including:

step 1, a fluid component model is established.

(1) Fluid component data of formation crude oil is obtained.

Using indoor physical simulation methods, based on high-temperature and high-pressure PVT experiments such as constant composition expansion experiments, multi-stage degassing experiments, and gas injection expansion experiments, the fluid components of formation crude oil are analyzed and obtained. The obtained data is shown in Table 1.

TABLE 1

| Component | $CO_2$ | $N_2$—$C_2$ | $C_3$—$iC_5$ | $nC_5$—$C_5$ | $C_9$—$C_{13}$ | $C_{14}$—$C_{17}$ | $C_{18}$—$C_{21}$ | $C_{22}$—$C_{25}$ | $C_{26}$—$C_{36+}$ | Total |
|---|---|---|---|---|---|---|---|---|---|---|
| Crude oil component content, % | 3.64 | 41.76 | 5.73 | 9.93 | 13.13 | 7.41 | 5 | 3.62 | 9.78 | 100 |

(2) The data is organized and imported into the numerical simulation software module.

The formation crude oil fluid components are imported into the Winprop module of the computer modelling group (CMG) numerical simulation software, and adjustable variables (such as component interaction coefficients, C30+ molar mass, and crude oil viscosity, etc.) are defined. The specific steps includes: opening the Winprop module in the CMG software, creating a basic fluid model first, opening "Component Selection/Properties," and selecting fluid components from the component library to create a component table based on the experimental component data; then, opening "Composition," inputting the crude oil composition and the mole fraction of the injected fluid, as shown in Table 2; opening the menu bar Calculations—Saturation Pressure, inputting the fluid saturation pressure of 17.33 MPa and the experimental temperature of 126.7 degrees Celsius (° C.); opening the Lab in the menu bar, inputting the data from the constant composition expansion experiment, multi-stage degassing experiment, and gas injection expansion experiment as shown in Table 3, Table 4, and Table 5 into the table, clicking run, and obtaining the basic fluid model.

TABLE 4

| Pressure, kPa | Crude oil volume factor, cubic meter/cubic meter ($m^3/m^3$) | Dissolved gas oil ratio, $m^3/m^3$ | Oil phase proportion | Crude oil viscosity, centipoise (cp) |
|---|---|---|---|---|
| 17330 | 1.3558 | 85.28 | 0.7051 | 0.67 |
| 13500 | 1.313 | 68.17 | 1.7155 | 0.74 |
| 10000 | 1.2659 | 50.89 | 0.7285 | 0.83 |
| 6500 | 1.2124 | 33.13 | 0.7455 | 0.96 |
| 3000 | 1.1489 | 14.57 | 0.7689 | 1.17 |
| 101.325 | 1.081 | 0 | 0.8019 | 1.92 |

TABLE 5

| Injection mole fraction | Saturation pressure, kPa | Experimental saturation pressure, kPa | Expansion factor |
|---|---|---|---|
| 0 | 17330 | 13852 | 1 |
| 0.1 | 18020 | 18020 | 1.046 |
| 0.2 | 19890 | 19890 | 1.104 |

TABLE 2

| Component | $CO_2$ | $N_2$—$C_2$ | $C_3$—$iC_5$ | $nC_5$—$C_5$ | $C_9$—$C_{13}$ | $C_{14}$—$C_{17}$ | $C_{18}$—$C_{21}$ | $C_{22}$—$C_{25}$ | $C_{26}$—$C_{36+}$ | Total |
|---|---|---|---|---|---|---|---|---|---|---|
| Crude oil component content. % | 3.64 | 41.76 | 5.73 | 9.93 | 13.13 | 7.41 | 5 | 3.62 | 9.78 | 100 |
| Component content of injected fluid. % | 93.1 | 6.89 | 0.01 | 0 | 0 | 0 | 0 | 0 | 0 | 100 |

45

TABLE 3

| Pressure, kilopascal (kPa) | Experimental relative volume | Oil phase density, kilogram per cubic meter ($kg/m^3$) | Pressure, kPa | Experimental relative volume | Oil phase density, $kg/m^3$ |
|---|---|---|---|---|---|
| 58000 | 0.94 | 750.1 | 36000 | 0.9669 | 729.3 |
| 56000 | 0.9422 | 748.4 | 33000 | 0.9713 | 726 |
| 54000 | 0.9444 | 746.7 | 30000 | 0.9759 | 722.5 |
| 52000 | 0.9466 | 744.9 | 28000 | 0.9792 | 720.1 |
| 50600 | 0.9482 | 743.7 | 26000 | 0.9826 | 717.6 |
| 48000 | 0.9512 | 741.3 | 24000 | 0.9862 | 715 |
| 45000 | 0.9548 | 738.5 | 22000 | 0.99 | 712.2 |
| 42000 | 0.9587 | 735.5 | 20000 | 0.9941 | 709.3 |
| 39000 | 0.9627 | 732.5 | 17330 | 1 | 705.1 |

TABLE 5-continued

| Injection mole fraction | Saturation pressure, kPa | Experimental saturation pressure, kPa | Expansion factor |
|---|---|---|---|
| 0.3 | 21920 | 21920 | 1.179 |
| 0.4 | 24160 | 24160 | 1.279 |
| 0.5 | 26650 | 26650 | 1.42 |
| 0.6 | 29380 | 29380 | 1.634 |
| 0.7 | 32160 | 32160 | 1.996 |
| 0.8 | 34050 | 34050 | 2 |

(3) The experimental results are fitted in the numerical simulation software.

Figure 2A:
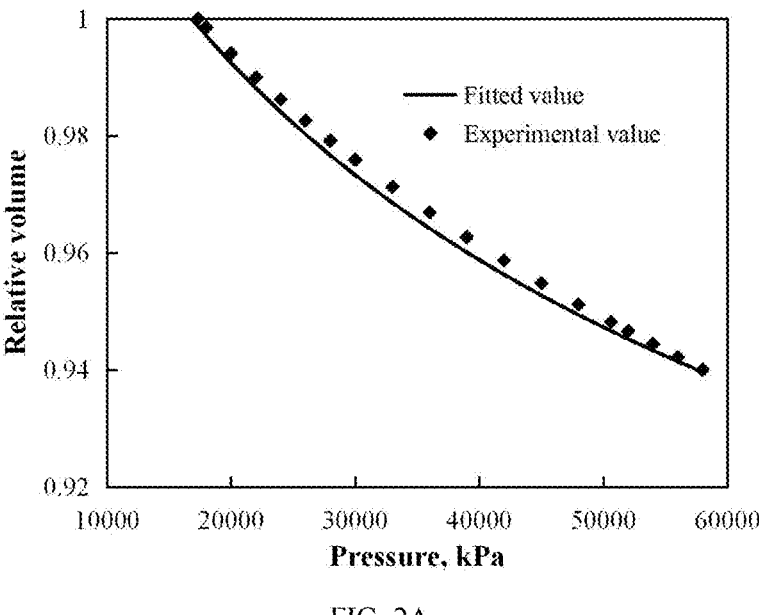
FIG. 2A is a graph of a relative volume fitting curve according to the embodiment of the present disclosure.
Figure 2B:
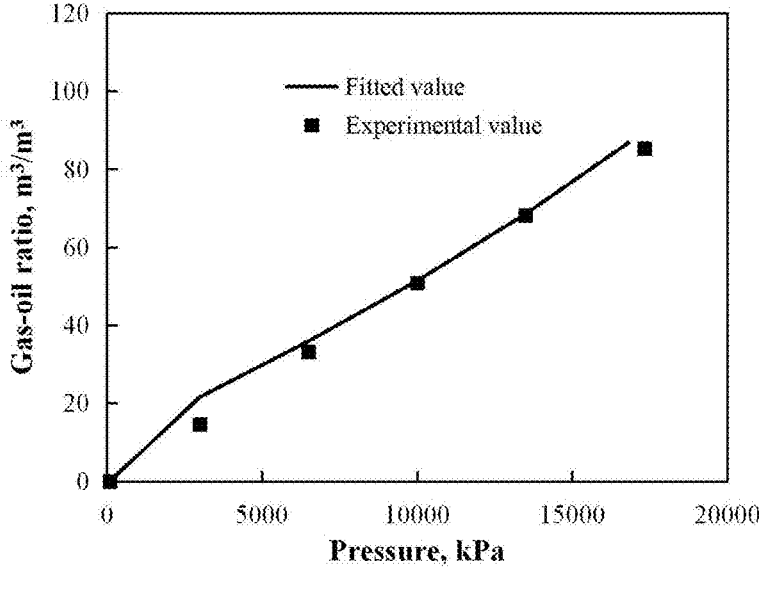
FIG. 2B is a graph of a gas-oil ratio fitting curve according to the embodiment of the present disclosure.
Figure 2C:
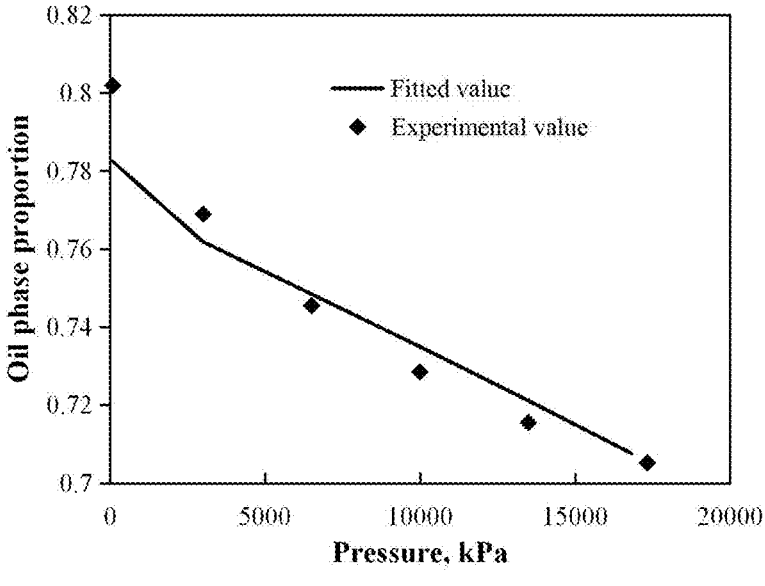
FIG. 2C is a graph of an oil phase proportion fitting curve according to the embodiment of the present disclosure.
Figure 2D:
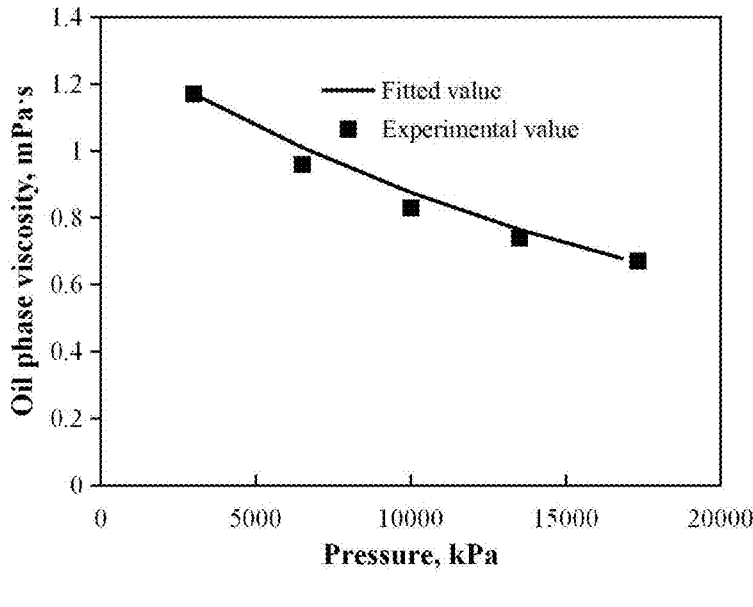
FIG. 2D is a graph of a fitting curve of oil phase viscosity according to the embodiment of the present disclosure.

After importing the data to create the basic fluid model, the experiments that need to be fitted to the "Regression Parameter" are added to form a tree diagram, and the adjustable variables are defined within the tree diagram, HcIntCoeExp-1 (1.2) is selected for the interaction coefficient, parameters such as the temperature, pressure, and volume of C30+ are set as adjustable variables. The viscosity calculation is achieved through the Pedersen model. All JST viscosity-related coefficients and exponents are selected in the Viscosity Parameters, run is clicked to start the calculation, and then the results are output in Simulation Results, as shown in FIG. 2A-FIG. 2D. FIG. 2A shows the relative volume fitting curve, FIG. 2B shows the gas-oil ratio fitting curve, FIG. 2C shows the oil phase proportion fitting curve, and FIG. 2D shows the oil phase viscosity fitting curve.

The accuracy of each variable in FIG. 2A-FIG. 2D meets the requirement of over 95%, and the fitting effect is good, providing a fluid model guarantee for the next simulation. The GEM fluid model is output, the Component is opened in the Builder module of CMG, the output GEM fluid model is imported, and the numerical simulation of formation fluids is completed.

Step 2, a three-dimensional reservoir model for different well pattern modes is established.

The phase behavior changes of $CO_2$ flooding fluid are complex. This embodiment uses a homogeneous three-dimensional model for well pattern optimization. Based on the GEM module of the CMG reservoir numerical simulation software, a three-dimensional reservoir model for different well pattern modes is established, and reservoir parameters such as depth, temperature, reservoir pressure, reservoir porosity, reservoir permeability, reservoir oil saturation, temperature gradient, pressure coefficient, and saturation pressure are set.

The specific settings of this embodiment are as follows. The number of grids is set to 20×20×3=1200, each grid is 50 meters (m)×50 m, and each grid is refined by 3×3. Reservoir property parameters: reservoir depth is 3500 m, reservoir temperature is 126° C., initial reservoir pressure is 55.0 milliPascal (MPa), reservoir porosity is 13.9%, reservoir permeability is 8 mD, reservoir oil saturation is 60%, formation crude oil viscosity is 1.98 milliPascal per second (mPa·s). The density of surface degassed crude oil is 0.862 gram per cubic centimeter (g/cm³). The formation crude oil volume factor is 1.14, and the formation crude oil viscosity is 0.44-1.25 mPa·s. The block temperature and pressure test show a geothermal gradient of 3.76 degrees Celsius per hectometer (° C./hm) and a pressure coefficient of 1.44, indicating that the reservoir is a high-temperature and high-pressure reservoir. The original formation pressure is 55.0 MPa, and the reservoir saturation pressure is 17.3 MPa.

Figure 3:
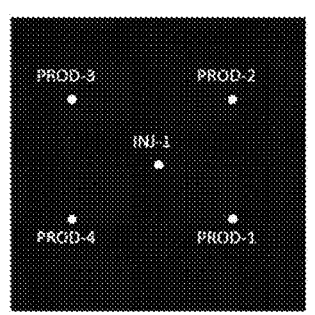
FIG. 3 is a diagram of three $CO_2$ injection well patterns according to the embodiment of the present disclosure.
Figure 3:
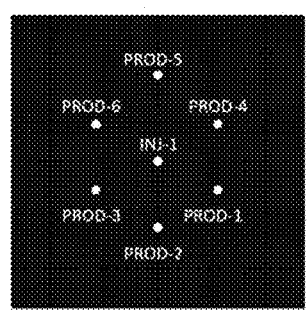
Figure 3:
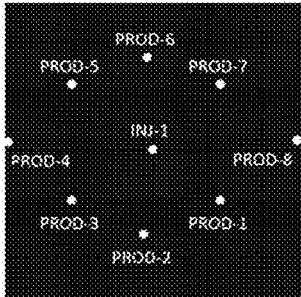

Based on the established three-dimensional reservoir model, the $CO_2$ flooding well pattern types are optimized, considering different well pattern conditions such as five-spot well pattern, inverted seven-spot well pattern, and inverted nine-spot well pattern as shown in FIG. 3. All three well pattern conditions are set with one injection well located at (10, 10, 1), and production wells are 4, 6, and 8 wells as shown in FIG. 3. The model adopts a production system with fixed $CO_2$ injection volume, injection pressure, and production pressure, set as single-well $CO_2$ injection volume of 100,000 cubic meter per day ($m^3/d$), injection pressure of 57.0 MPa, production pressure of 18.0 MPa, and production duration of 30 years.

Step 3, well pattern optimization under $CO_2$ incomplete miscible displacement conditions.

After the reservoir setting is completed, the dat file of Builder module is saved, the numerical simulation operation is carried out based on GEM module of CMG, and the sr3 file with completed operation results is opened through the Result module. The three front laws in the operation results are analyzed, and parameters such as reservoir recovery rate, cumulative oil production, oil exchange ratio, and storage ratio are compared to perform the well pattern optimization based on $CO_2$ incomplete miscible displacement characteristics.

The three front laws are defined as follows.

In the $CO_2$ miscible flooding process, the formation pressure is maintained above the miscible pressure as much as possible to ensure recovery efficiency. Therefore, the position where the formation pressure between the injection and production wells equals the minimum miscible pressure of $CO_2$ and crude oil is called the miscible pressure front.

Supercritical carbon dioxide may dissolve in crude oil and formation water, and convect and diffuse with oil and water fluids. Therefore, the position closest to the injection well swept by the zero mole fraction of $CO_2$ component between injection and production wells during the displacement process is defined as the component front.

Under normal temperature and pressure, $CO_2$ and crude oil are two incompatible phases. Under formation temperature and pressure conditions, supercritical $CO_2$ and crude oil will dissolve into one phase. Therefore, the position closest to the production well swept by the zero oil-gas interfacial tension between the injection and production wells during the displacement process is defined as the phase front.

(1) Well pattern optimization based on the miscible pressure front, component front, and phase front.

By analyzing different field maps (pressure field map, $CO_2$ concentration field map, and oil-gas interfacial tension field map) in the numerical simulation results under different well patterns, when the miscible pressure front and component front contact, that is, when the reservoir begins to be in an incomplete miscible state, three front migration laws are obtained, the front migration laws are analyzed, the retreat speed of the miscible pressure front, $CO_2$ sweep efficiency, and miscibility degree are judged, and the front analysis results are obtained.

The specific steps are as follows.

Figure 5A:
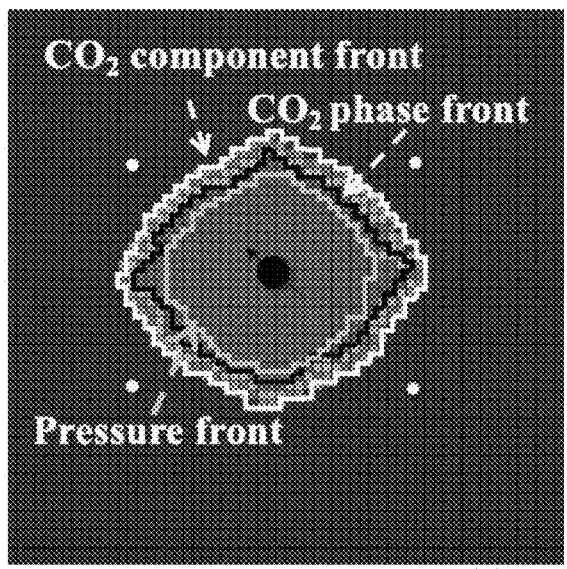
FIG. 5A is a three-front migration map of a five-spot well pattern with 0.23 pore volume (PV) according to the embodiment of the present disclosure.
Figure 5B:
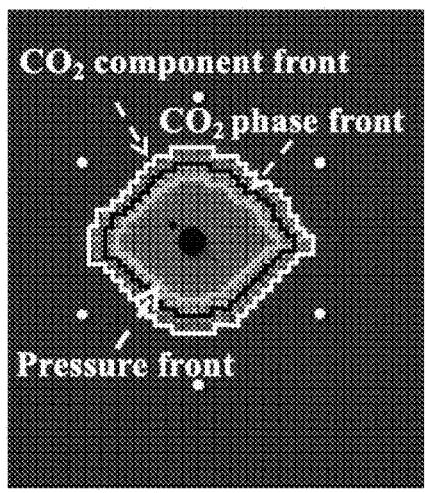
FIG. 5B is a three-front migration map of an inverted seven-spot well pattern, with 0.17 PV according to an embodiment of the present disclosure.
Figure 5C:
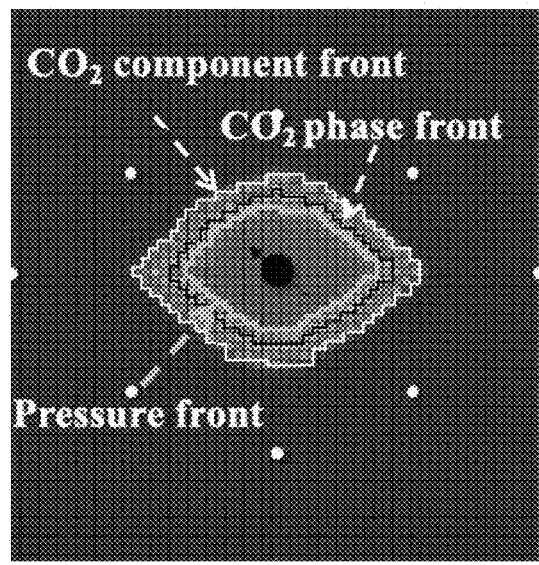
FIG. 5C is a three-front migration map of an inverted nine-spot well pattern, with 0.16 PV according to an embodiment of the present disclosure.

The Aerial View plane display interface in the result file is opened. Based on different field maps (pressure field map, $CO_2$ concentration field map, and oil-gas interfacial tension field map), when the pressure front and component front contact, that is, when the reservoir begins to be in an incomplete miscible state, three front migration laws are obtained, the front migration laws are analyzed, and the analysis results are shown in FIG. 5A-FIG. 5B. FIG. 5A shows the three-front migration map of the five-spot well pattern with 0.23 PV, FIG. 5B shows the three-front migration map of the inverted seven-spot well pattern with 0.17 PV, and FIG. 5C shows the three-front migration map of the inverted nine-spot well pattern with 0.16 PV.

(2) Well pattern optimization based on production parameters.

Figure 4A:
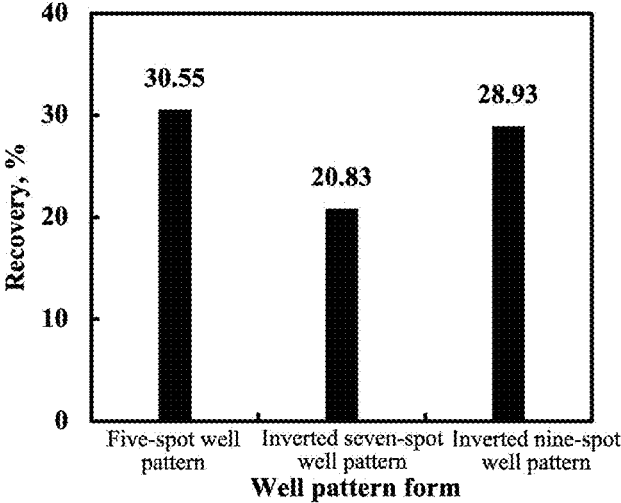
FIG. 4A is a comparison graph of reservoir recovery rates under different $CO_2$ injection well patterns according to the embodiment of the present disclosure.
Figure 4B:
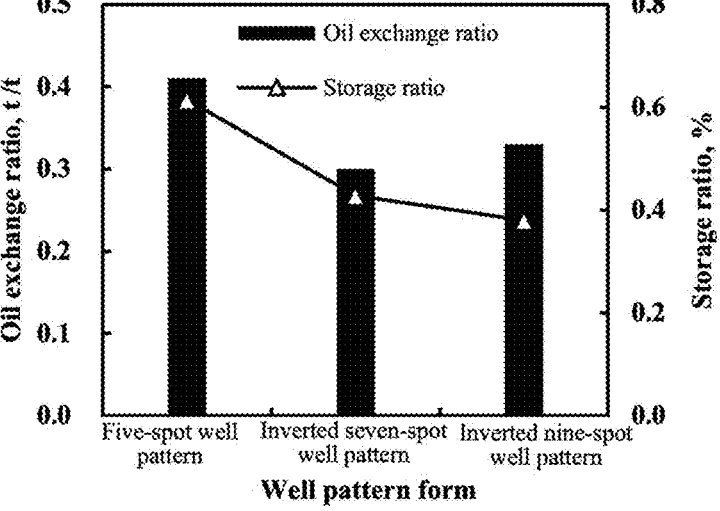
FIG. 4B is a comparison graph of oil exchange ratios and storage ratios under different $CO_2$ injection well patterns according to the embodiment of the present disclosure.

By analyzing the oil production, gas production, and gas injection curves in the numerical simulation results under different well patterns, the reservoir recovery rate, cumulative oil production, oil exchange ratio, and storage ratio under different well patterns are compared. The results are shown in FIG. 4A and FIG. 4B. FIG. 4A shows the comparison of reservoir recovery rates under different well patterns, and FIG. 4B shows the comparison of oil exchange ratios and storage ratios under different well patterns. Comprehensively considering crude oil production, economic viability of crude oil development, and the social benefits of $CO_2$ storage, the production parameter comparison results are obtained.

(3) Well pattern optimization based on $CO_2$ incomplete miscible displacement characteristics.

The front analysis results and production parameter comparison results are comprehensively analyzed to perform the well pattern optimization based on $CO_2$ incomplete miscible displacement characteristics, and the optimal $CO_2$ flooding well pattern is obtained.

From the two analysis results, it may be seen that the five-spot well pattern has the injection and production directions perpendicular to the fracturing direction, the maximum injection-production well ratio, the minimum single well gas injection requirement for pressure maintenance production, and the five-spot well pattern has the slowest retreat of the miscible pressure front, the largest sweep efficiency (increased by 6-10%), and the highest miscibility degree (increased by 8-10%) compared to the inverted seven-spot well pattern and inverted nine-spot well pattern. Therefore, comprehensively considering the recovery rate, oil exchange ratio, storage ratio, and the incomplete miscible displacement characteristics based on the three front migration laws, the final optimization result is to adopt the five-spot well pattern for development.

The above-mentioned embodiments only describe the preferred mode of the present disclosure, and do not limit the scope of the present disclosure. Under the premise of not departing from the design spirit of the present disclosure, various modifications and improvements made by one of ordinary skill in the art to the technical solution of the present disclosure should fall within the protection scope determined by the claims of the present disclosure.

What is claimed is:

1. A well pattern optimization method implemented by a simulation software based on $CO_2$ incomplete miscible displacement characteristics, comprising:

obtaining fluid component data of formation crude oil by performing high-temperature and high-pressure PVT experiments comprising constant composition expansion experiments, multi-stage degassing experiments, and gas injection expansion experiments, and establishing a fluid component model based on the fluid component data;

establishing a three-dimensional reservoir model based on the fluid component model, and setting reservoir parameters for the three-dimensional reservoir model;

performing simulation operation on the three-dimensional reservoir model with set reservoir parameters under different $CO_2$ flooding well pattern modes, wherein each $CO_2$ flooding well pattern mode is based on a production system comprising one injection well and at least one production well operating with a fixed $CO_2$ injection volume, a fixed injection pressure, and a fixed production pressure, and obtaining simulation operation results; and performing analysis of fronts and production parameter comparison on the simulation operation results, and obtaining an optimal $CO_2$ flooding well pattern mode;

wherein the fronts comprise: a miscible pressure front, a component front, and a phase front, wherein the miscible pressure front is a position with a formation pressure between injection and production wells equaling a minimum miscible pressure of $CO_2$ and crude oil, the component front is a position closest to an injection well swept by a zero mole fraction of a $CO_2$ component between the injection and production wells during a displacement process, and the phase front is a position closest to a production well swept by a zero oil-gas interfacial tension between the injection and production wells during the displacement process;

wherein performing the analysis of the fronts on the simulation operation results comprises:

analyzing different field maps of the simulation operation results under different $CO_2$ flooding well pattern modes, and obtaining migration laws of the miscible pressure front, the component front, and the phase front;

based on the migration laws of the miscible pressure front, the component front, and the phase front, judging retreat speeds of the miscible pressure front, $CO_2$ sweep efficiencies, and miscibility degrees under different $CO_2$ flooding well pattern modes; and obtaining front analysis results based on the retreat speeds of the miscible pressure front, the $CO_2$ sweep efficiencies, and the miscibility degrees;

wherein performing the production parameter comparison on the simulation operation results comprises:

analyzing oil production, gas production, and gas injection curves in the simulation operation results under different $CO_2$ flooding well pattern modes, comparing reservoir recovery rates, cumulative oil production, oil exchange ratios, and storage ratios under different $CO_2$ flooding well pattern modes, and obtaining production parameter comparison results;

wherein obtaining the optimal $CO_2$ flooding well pattern mode comprises:

combining the front analysis results and the production parameter comparison results for analysis and selection, and obtaining the optimal $CO_2$ flooding well pattern mode, wherein the method is implemented in connection with the $CO_2$ flooding production system during $CO_2$ injection development operations of a reservoir.

2. The well pattern optimization method based on the $CO_2$ incomplete miscible displacement characteristics according to claim 1, wherein obtaining the fluid component data of the formation crude oil comprises:

analyzing the formation crude oil using the high-temperature and the high-pressure PVT experiments to obtain the fluid component data.

3. The well pattern optimization method based on the $CO_2$ incomplete miscible displacement characteristics according to claim 1, wherein establishing the fluid component model based on the fluid component data comprises:

fitting the fluid component data and experimental result data from the high-temperature and high-pressure PVT experiments, and outputting the fluid component model when a fitting effect is greater than a preset value.

4. The well pattern optimization method based on the $CO_2$ incomplete miscible displacement characteristics according to claim 1, wherein the reservoir parameters comprise: a reservoir depth, a reservoir temperature, a reservoir pressure, a reservoir porosity, reservoir permeability, reservoir oil saturation, a temperature gradient, a pressure coefficient, and a reservoir saturation pressure.

\*    \*    \*    \*    \*